United States Patent
Sawachi et al.

(10) Patent No.: US 12,525,466 B2
(45) Date of Patent: Jan. 13, 2026

(54) PROCESSING APPARATUS AND PROCESSING METHOD

(71) Applicant: TOKYO ELECTRON LIMITED, Tokyo (JP)

(72) Inventors: Atsushi Sawachi, Miyagi (JP); Kosuke Ogasawara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 202 days.

(21) Appl. No.: 17/522,660

(22) Filed: Nov. 9, 2021

(65) Prior Publication Data

US 2022/0148890 A1    May 12, 2022

(30) Foreign Application Priority Data

Nov. 9, 2020 (JP) .................. 2020-186772

(51) Int. Cl.
*H01L 21/67* (2006.01)
*C23C 16/455* (2006.01)
*H01J 37/32* (2006.01)

(52) U.S. Cl.
CPC .. *H01L 21/67017* (2013.01); *C23C 16/45561* (2013.01); *H01J 37/3244* (2013.01); *H01J 37/32449* (2013.01); *H01L 21/6719* (2013.01)

(58) Field of Classification Search
None
See application file for complete search history.

(56) References Cited

U.S. PATENT DOCUMENTS

| | | | | |
|---|---|---|---|---|
| 5,470,390 A | * | 11/1995 | Nishikawa | B01F 23/19 118/715 |
| 6,085,762 A | * | 7/2000 | Barton | B08B 3/102 257/E21.255 |
| 2002/0189709 A1 | * | 12/2002 | Noah | F17C 9/00 141/231 |
| 2009/0170332 A1 | * | 7/2009 | Komiyama | F17C 7/00 438/758 |
| 2012/0244685 A1 | * | 9/2012 | Suzuki | H01L 21/6719 118/699 |
| 2013/0186471 A1 | * | 7/2013 | Nagase | G05D 7/0652 702/47 |
| 2015/0020890 A1 | * | 1/2015 | Koike | B01F 35/2113 137/13 |

(Continued)

FOREIGN PATENT DOCUMENTS

| | | |
|---|---|---|
| JP | H06-319972 A | 11/1994 |
| JP | 2005-243858 A | 9/2005 |

(Continued)

*Primary Examiner* — Parviz Hassanzadeh
*Assistant Examiner* — Margaret Klunk
(74) *Attorney, Agent, or Firm* — XSENSUS LLP

(57) ABSTRACT

A processing apparatus which processes a substrate is disclosed. The processing apparatus comprises: a plurality of processing chambers which process the substrate in an atmosphere of a desired processing gases; a plurality of tank units provided for each of the plurality of processing chambers, the plurality of tank units including a plurality of tanks configured for temporarily storing the processing gases; and one or more gas boxes supplying the processing gases to the processing chambers via the tank units. The substrate processing apparatus allows the number of gas boxes to be reduced.

12 Claims, 15 Drawing Sheets

(56) References Cited

U.S. PATENT DOCUMENTS

| | | | |
|---|---|---|---|
| 2015/0243493 A1* | 8/2015 | Yamazaki | C23C 16/45557 438/778 |
| 2019/0106787 A1* | 4/2019 | Ohno | C23C 16/45563 |
| 2019/0301016 A1* | 10/2019 | Kang | C23C 16/34 |

FOREIGN PATENT DOCUMENTS

| | | |
|---|---|---|
| JP | 2020-084251 A | 6/2020 |
| WO | 2017/212546 A1 | 12/2017 |

* cited by examiner

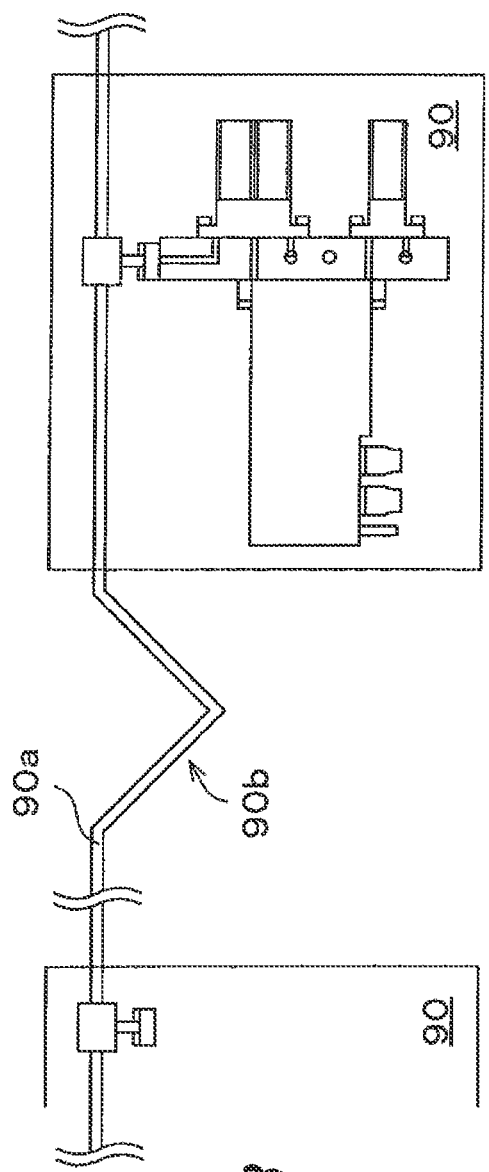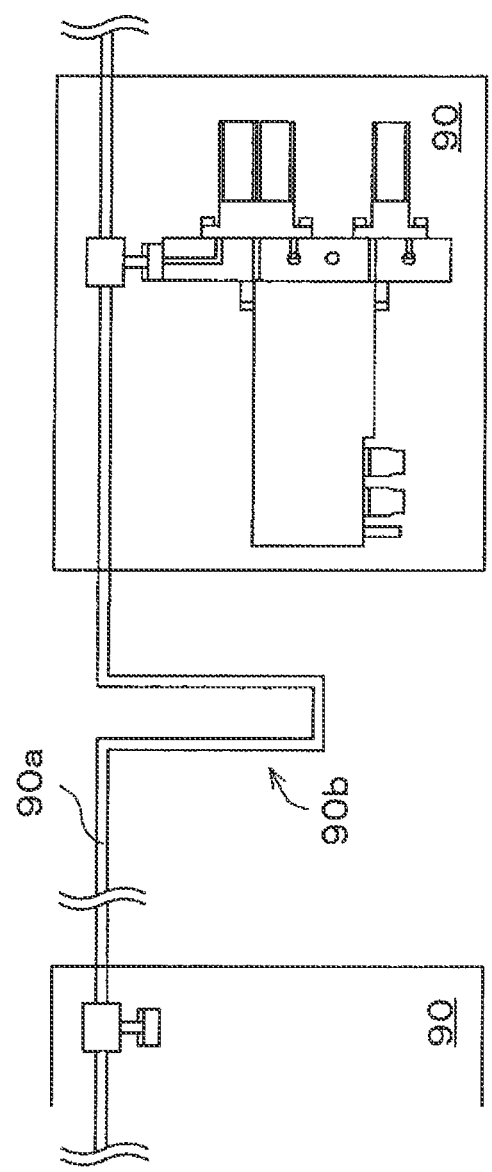
FIG. 3A
FIG. 3B

PROCESSING APPARATUS AND PROCESSING METHOD

CROSS-REFERENCE TO RELATED APPLICATIONS

This application claims priority to Japanese Patent Application No. 2020-186772 filed on Nov. 9, 2020, the entire contents of which are incorporated herein by reference.

TECHNICAL FIELD

The present invention relates to a processing apparatus and a processing method.

BACKGROUND

In Japanese Patent Application Publication No. 2005-243858, a processing apparatus, in which a plurality of processing chambers are positioned around a transfer chamber including a transfer unit configured to transfer a processing target object and predetermined processes are performed on the processing target object in predetermined gas atmospheres, is disclosed. According to the processing apparatus, a gas box, which accommodates a gas control unit for gas introduction into each processing chamber, is installed in an upper portion or lower portion of the processing chamber.

SUMMARY

According to the technology of the present invention, a substrate processing apparatus including a plurality of gas processing chambers around a transfer chamber allows the number of gas boxes installed to supply processing gases to the gas processing chambers to be reduced.

In accordance with an aspect of the present disclosure, there is provided a processing apparatus, which processes a substrate. The processing apparatus comprises: a plurality of processing chambers which process the substrate in an atmosphere of a desired processing gases; a plurality of tank units provided for each of the plurality of processing chambers, the plurality of tank units including a plurality of tanks configured for temporarily storing the processing gases; and one or more gas boxes supplying the processing gases to the processing chambers via the tank units.

BRIEF DESCRIPTION OF THE DRAWINGS

FIG. 3A-3B is an explanatory diagram illustrating a connection structure of a gas box.

DETAILED DESCRIPTION

Figure 1:
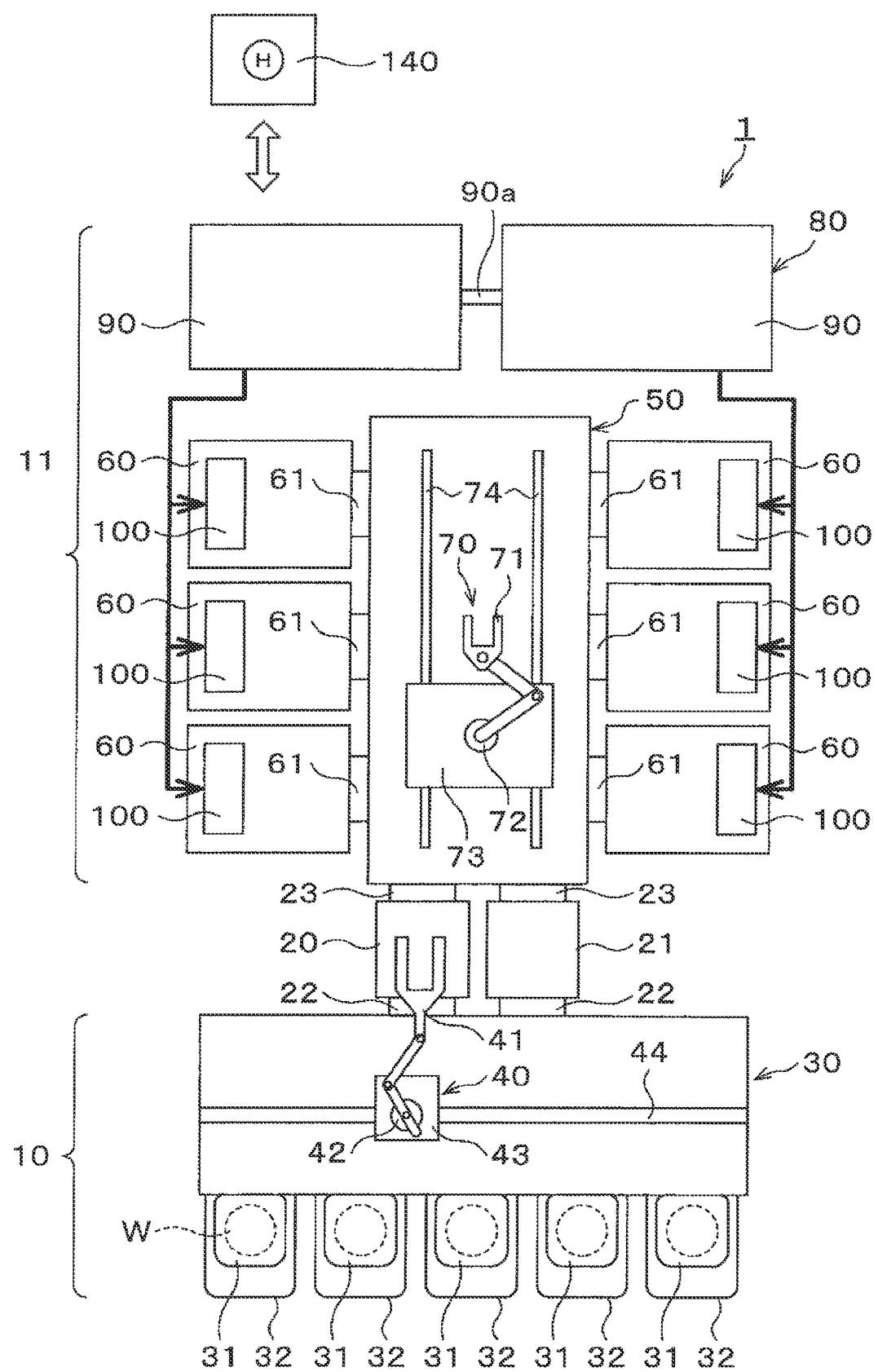
FIG. 1 is a schematic plan view illustrating a configuration of a wafer processing apparatus according to a present embodiment.

In a manufacturing process of a semiconductor device, various gas processes, such as a film formation process, a cleaning process, and a plasma process, are performed on a semiconductor wafer (hereinafter, simply referred to as a "wafer"). These gas processes are performed in, for example, vacuum processing chambers which are controllable to be decompression atmospheres. In addition, in a wafer processing apparatus in which the gas processes are performed, there is a case in which a plurality of corresponding vacuum processing chambers are installed with respect to a transfer chamber in which wafer transfer is performed in a vacuum atmosphere.

In the above-described Japanese Patent Application Publication No. 2005-243858, a processing apparatus, in which a plurality of processing chambers are positioned around a transfer chamber including a transfer unit configured to transfer a processing target object (wafer) and predetermined processes are performed in predetermined gas atmosphere, is disclosed. According to the processing apparatus described in Japanese Patent Application Publication No. 2005-243858, a plurality of gas boxes for introducing processing gases into the processing chambers are installed in the processing chambers.

However, when the plurality of gas boxes are installed to correspond to the plurality of vacuum processing chambers as described above, since as much cost or space is required as the number of the corresponding gas boxes to be installed, reducing the number of the corresponding gas boxes to be installed in the processing apparatus is required.

However, when the number is reduced by simply integrating the plurality of gas boxes, there is a problem of reducing the number of gas processes (recipes) which are performable by the processing apparatus at once. That is, when different gas processes are performed in the vacuum processing chambers in parallel, and kinds of the processing gases used in the vacuum processing chambers are different, the processing gases may not be properly supplied to the vacuum processing chambers. As described above, in the conventional processing apparatus, from a viewpoint of reducing the number of the gas boxes to be installed in the processing apparatus, there is a room for improvement.

The technology according to the present invention is introduced by considering the situation. In a substrate processing apparatus in which a plurality of gas processing chambers are provided around a transfer chamber, the number of gas boxes installed to supply processing gases to the gas processing chambers is reduced. Hereinafter, a wafer processing apparatus will be described as the processing apparatus according to the present embodiment with reference to the accompanying drawings. In addition, in the present specification and the drawings, the same reference numerals are assigned to elements having substantially the same functional configuration to omit repeated descriptions thereof.

<Wafer Processing Apparatus>

First, a wafer processing apparatus according to the present embodiment will be described. FIG. 1 is a schematic plan view illustrating a configuration of a wafer processing apparatus 1 according to the present embodiment. In the wafer processing apparatus 1, desired gas processes, for example, a film formation process, a cleaning process, and other plasma processes are performed on wafers W, that is, substrates.

As shown in FIG. 1, the wafer processing apparatus 1 has a structure in which a stand-by unit 10 and a decompression unit 11 are integrally connected through load lock modules 20 and 21. The stand-by unit 10 includes a stand-by module which performs a desired process on the wafer W at an atmospheric pressure. The decompression unit 11 includes a decompression module which performs a desired process on the wafer W in a decompression atmosphere.

The load lock modules 20 and 21 are installed to connect a loader module 30, which will be described below, of the stand-by unit 10 and a transfer module 50, which will be described below, of the decompression unit 11 through gate valves 22 and 23. The load lock modules 20 and 21 are configured to hold the wafers W temporarily. In addition, in interiors of the load lock modules 20 and 21, an atmospheric pressure and a decompression atmosphere (vacuum state) are switched.

The stand-by unit 10 includes the loader module 30 having a wafer transfer unit 40, which will be described below, and load ports 32 on which front open unified pods (FOUPs) 31 capable of storing the plurality of wafers W are placed. In addition, in the loader module 30, an orientation module (not shown) which adjusts a horizontal direction of the wafer W and a containment module (not shown) which contains the plurality of wafers W may be installed to be adjacent to each other.

An interior of the loader module 30 is formed as a rectangular case, and an atmospheric pressure in an interior of the case is maintained. The plurality of load ports 32, for example, five load ports 32, are installed on one side surface constituting a long side of the case of the loader module 30. The load lock modules 20 and 21 are installed on the other side surface constituting a long side of the case of the loader module 30.

The wafer transfer unit 40, which transfers the wafer W, is installed in the loader module 30. The wafer transfer unit 40 includes a transfer arm 41 which holds and moves the wafer W, a rotary support 42 which rotatably supports the transfer arm 41, and a rotary table 43 on which the rotary support 42 is installed. In addition, a guide rail 44, which elongates in a longitudinal direction of the loader module 30, is provided in the loader module 30. The rotary table 43 is installed on the guide rail 44, and the wafer transfer unit 40 is configured to be movable along the guide rail 44.

The decompression unit 11 includes the transfer module 50 which transfers the wafers W therein and the processing modules 60 which perform desired processes on the wafers W transferred from the transfer module 50. A decompression atmosphere is maintained in each of the transfer module 50 and the processing modules 60. In addition, according to the present embodiment, the plurality of processing modules 60, for example, six processing modules 60, are connected to one transfer module 50. In addition, the number or layout of the processing modules 60 is not limited to the present embodiment and may be arbitrarily set.

An interior of the transfer module 50 is formed as a rectangular case, and the transfer module 50 is connected to the load lock modules 20 and 21 as described above. The transfer module 50 transfers the wafer W loaded in the load lock module 20 to one processing module 60, in which a desired process is performed on the wafer W. Then, the transfer module 50 unloads the wafer W to the stand-by unit 10 through the load lock module 21.

A wafer transfer unit 70, which transfers the wafer W, is installed in the transfer module 50. The wafer transfer unit 70 includes a transfer arm 71 which holds and moves the wafer W, a rotary support 72 which rotatably supports the transfer arm 71, and a rotary table 73 on which the rotary support 72 is installed. In addition, guide rails 74 which elongate in a longitudinal direction of the transfer module 50 are installed in the transfer module 50. The rotary table 73 is installed on the guide rails 74, and the wafer transfer unit 70 is configured to be movable along the guide rails 74.

In addition, the transfer module 50 receives the wafer W held by the load lock module 20 using the transfer arm 71 and transfers the wafer W to the arbitrary processing module 60. After a desired process is performed on the wafer W which is being held by the transfer arm 71 in the processing module 60, the transfer arm 71 unloads the wafer W to the load lock module 21.

The processing modules 60 as processing chambers are installed close to the transfer module 50 with gate valves 61 interposed therebetween. In the processing modules 60, arbitrary gas processes, for example, a film formation process, a cleaning process, and other plasma processes, are performed according to objectives of wafer processes.

In addition, in the decompression unit 11, a gas supply module 80 for supplying target processing gases to the processing modules 60 is installed. The gas supply module 80 includes gas boxes 90 accommodating gas control units which control the supply of gases to the processing modules 60 and a plurality of tank units 100 (for example, six tank units 100) which is installed to correspond to the processing modules 60 in the present embodiment and which temporarily store processing gases for the corresponding processing modules 60.

Figure 2:
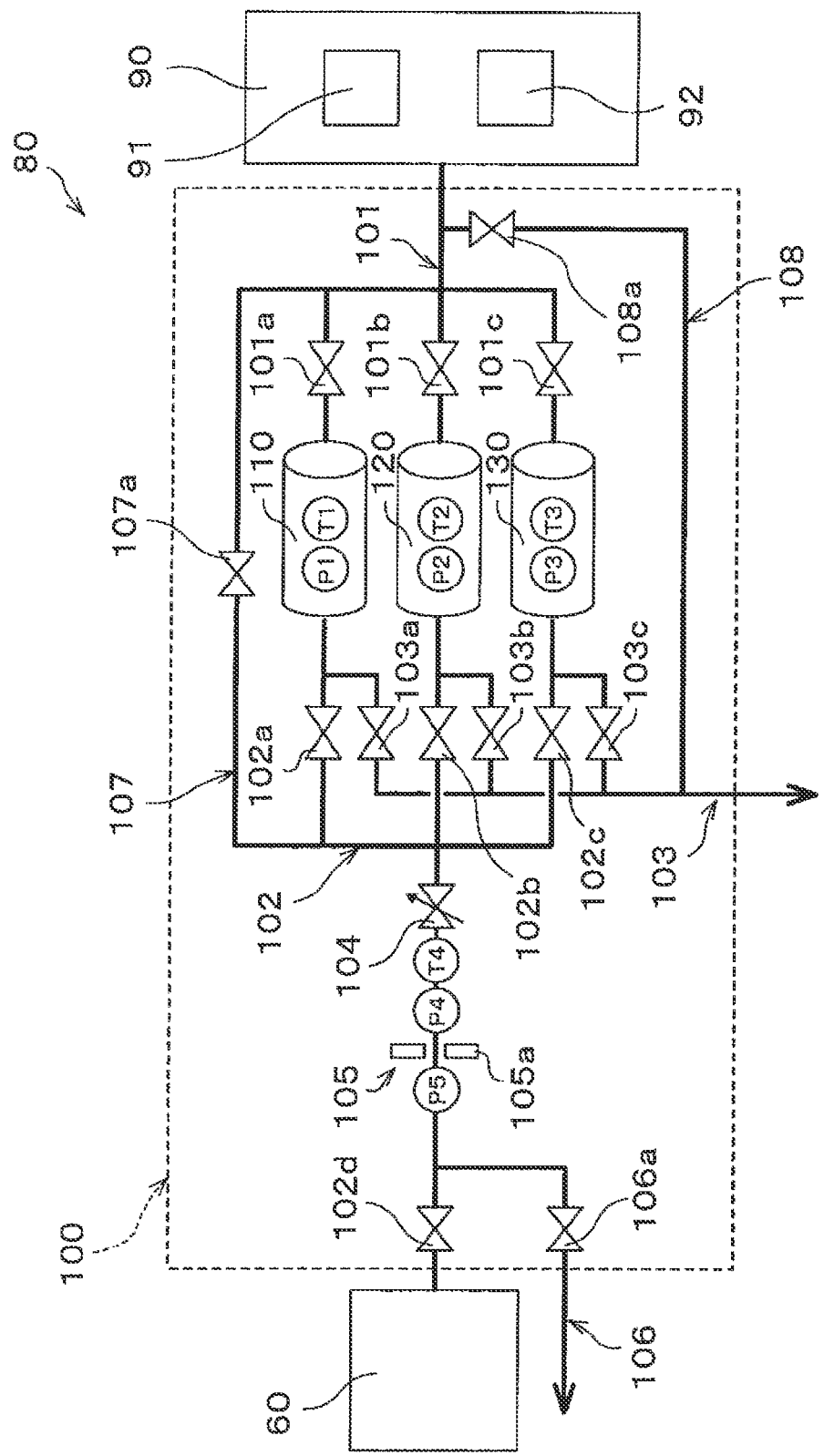
FIG. 2 is a schematic block diagram illustrating a configuration of a gas supply module.

As shown in FIG. 2, in the gas box 90, gas sources 91 and flow controllers 92 for supplying one or more gasses to the tank units 100 are installed. In one embodiment, the gas box 90 is configured to supply one or more gases to the tank units 100 from the corresponding gas sources 91 through the corresponding flow controllers 92. The flow controllers 92 may include, for example, mass flow controllers or pressure-controlled flow controllers. In addition, in the following description, one gas or a mixed gas including one or more gases supplied from the gas box 90 to the processing module 60 for the corresponding gas process will be referred to as a "processing gas."

In addition, the number of the gas boxes 90 to be installed in the wafer processing apparatus 1 is not specifically limited, and one or more gas boxes 90 may be installed. In addition, in the present embodiment, although an example in which two gas boxes 90 are installed in the wafer processing apparatus 1 is described as shown in FIG. 1, since the number of the gas boxes 90 to be installed is smaller than the number of the processing modules 60 to be installed, a cost or space for installation of the corresponding gas boxes 90 can be reduced when compared to a conventional wafer processing apparatus.

In addition, two gas boxes 90 are connected by a connection pipe 90a through which the processing gas is flowable between the corresponding gas boxes 90. In this case, as shown in FIG. 3A or 3B, a cushion part 90b (bent part) for absorbing rigidity generated when the gas boxes 90 are connected may be formed on the connection pipe 90a.

The plurality of tank units 100, for example, six tank units 100, are installed to correspond to the processing modules 60 in the present embodiment. In the tank units 100, various processing gases supplied from the gas boxes 90 are stored in tanks 110, 120, and 130, which will be described below, and then, are supplied to the processing modules 60. In other words, the tank unit 100 is connected to the gas box 90 at an upstream side thereof through an upstream side pipe 101 and the processing module 60 at a downstream side thereof through a downstream side pipe 102. In addition, in the following description, there are cases in which an upstream side (a side of the gas box 90) of a supply path of the processing gas is simply referred to as an "upstream side," and a downstream side (a side of the processing module 60) of the supply path of the processing gas is simply referred to as a "downstream side."

As shown in FIG. 2, the plurality of tanks, for example, three tanks 110, 120, and 130, which temporarily store the processing gases supplied from the gas box 90, are installed in the tank unit 100 in the present embodiment. Pressure gauges P1, P2, and P3 and thermometers T1, T2, and T3 are installed in three tanks 110, 120, and 130, respectively and are configured to measure pressures and temperatures of the processing gases with which the tanks are filled.

Valves 101a, 101b, and 101c respectively corresponding to three tanks 110, 120, and 130 are installed in the upstream side pipe 101 connecting the gas box 90 and the tank unit 100. In addition, valves 102a, 102b, and 102c respectively corresponding to tanks 110, 120, and 130 are installed in the downstream side pipe 102 connecting the tank unit 100 and the processing module 60. In addition, the filling of the tanks with the processing gases and the supply of the processing gases to the processing modules 60 from the tanks may be individually controlled by controllers which control opening and closing of the valves.

In addition, exhaust pipes 103 for exhausting the tanks are connected to three tanks 110, 120, and 130. An exhaust unit (not shown), such as a vacuum pump, is connected to the exhaust pipe 103 at a downstream side. Valves 103a, 103b, and 103c are installed in the exhaust pipes 103 to correspond to three tanks 110, 120, and 130, respectively, and exhaust of the tanks may be individually controlled by controllers which control opening and closing of the valves.

A control valve 104, an orifice type pressure gauge 105 (hereinafter, simply referred to as an "orifice 105"), and a valve 102d are sequentially installed at a downstream side of the valves 102a, 102b, and 102c of the downstream side pipe 102, that is, between the valves 102a, 102b, and 102c and the processing module 60.

The control valve 104 controls a flow rate of the processing gas supplied to the processing module 60 on the basis of, for example, a viscosity, a temperature, a pressure, kinds of gases constituting the processing gas, and the like, of the processing gas flowing through the downstream side pipe 102. The orifice 105 includes a pressure gauge P4 at an upstream side of an orifice plate 105a, in which a hole is formed, and a pressure gauge P5 at a downstream side thereof and calculates a flow rate of the processing gas flowing through the downstream side pipe 102 on the basis of a pressure difference between the pressure gauges P4 and P5. In addition, a thermometer T4 for measuring a temperature of the processing gas is installed at the upstream side of the orifice 105.

An exhaust pipe 106 is connected to the downstream side pipe 102 at the downstream side of the orifice 105, that is, between the orifice 105 and the valve 102d. An exhaust unit (not shown), such as a vacuum pump, is connected to the exhaust pipe 106 at a downstream side. A valve 106a is installed in the exhaust pipe 106. In addition, in the tank unit 100, the processing gas may be controlled to be supplied to the processing module 60 from the gas box 90 by controllers which control opening and closing of the valve 102d and the valve 106a.

In addition, in the tank unit 100, a bypass pipe 107 mutually connecting the upstream side pipe 101 and the downstream side pipe 102 and an exhaust pipe 108 for exhausting an interior of the upstream side pipe 101 are further installed.

One end portion of the bypass pipe 107 is connected to the upstream side pipe 101 at the upstream side of the valves 101a, 101b, and 101c, and the other end portion thereof is connected to the downstream side pipe at the downstream side of the valves 102a, 102b, and 102c (that is, between the valves 102a, 102b, and 102c and the control valve 104). A valve 107a is installed in the bypass pipe 107, and the processing gas may be supplied to the processing module 60 without flowing through three tanks 110, 120, and 130 by controllers which control opening and closing of the valves 102a, 102b, and 102c and the valve 107a.

One end portion of the exhaust pipe 108 is connected to the upstream side pipe 101 at the upstream side of the valves 101a, 101b, and 101c, and the other end portion thereof is connected to an exhaust unit (not shown), such as a vacuum pump. A valve 108a is installed in the exhaust pipe 108 and configured to exhaust a residual gas in the upstream side pipe 101 using a controller which controls opening and closing of the corresponding valve 108a.

A controller 140 is installed in the wafer processing apparatus 1. The controller 140 includes a computer including, for example, a central processing unit (CPU) and a memory, and includes a program storage device (not shown). In the program storage device, a program configured to control the gas process for the wafer W in the wafer processing apparatus 1 is stored. In addition, in the program storage device, a program configured to control a supply operation for the processing gas, which will be described below, is further stored. In addition, the program has been written in a storage medium H readable by a computer and may be installed in the controller 140 from the corresponding storage medium H.

As described above, although various exemplary embodiments have been described, the present invention is not limited to the above-described exemplary embodiments and may be variously added, omitted, substituted, and modified. In addition, components in another embodiment may be combined to constitute still another embodiment.

The wafer processing apparatus 1 according to the present embodiment is formed as described above. Next, a method of supplying a processing gas to the processing module 60 will be described as a processing method in the wafer processing apparatus 1.

Figure 4:
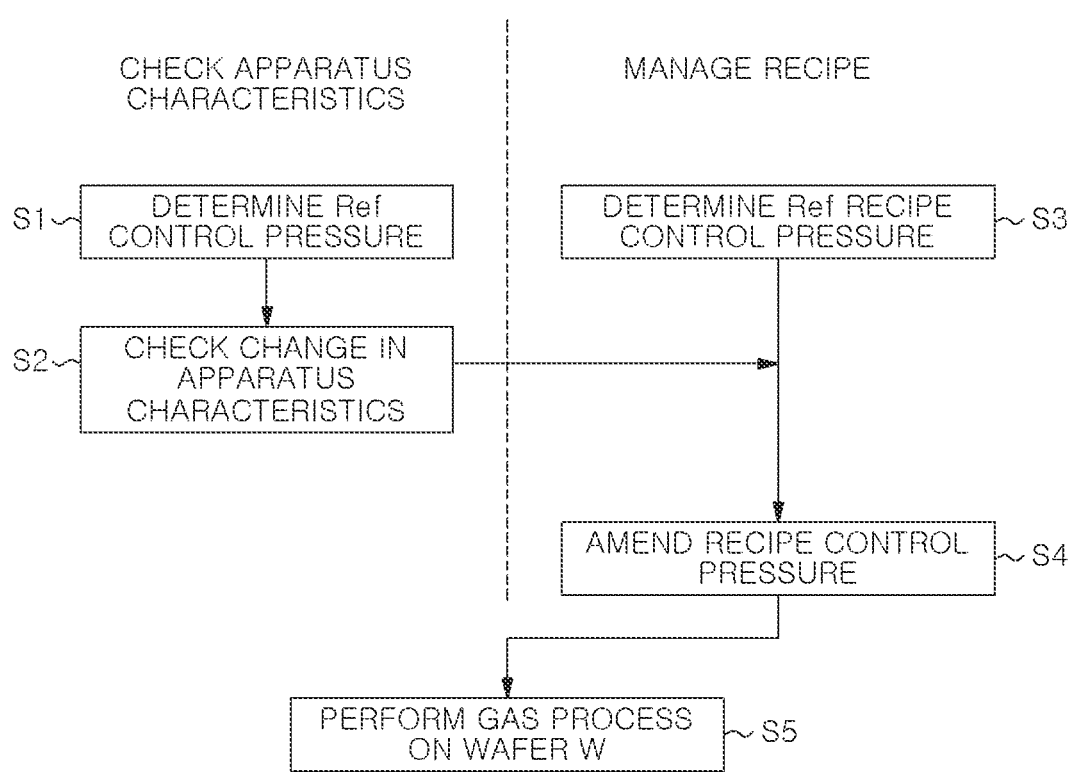
FIG. 4 is a flowchart showing main processes of a processing method according to the present embodiment.

FIG. 4 is a flowchart showing main processes of the wafer processing apparatus 1. As shown in FIG. 4, in the wafer processing apparatus 1, before performing a gas process (step S5 in FIG. 4) on the wafer W starts, checking of apparatus characteristics (steps S1 and S2 of FIG. 4) and recipe management (steps S3 and S5 of FIG. 4) are performed as preprocesses. In the following description, the preprocesses (steps S1 to S4) and a gas process (step S5) for the wafer W will be described sequentially.

<Step S1: Ref Control Pressure Determination>

In the processing module 60, a supply pressure or supply flow rate of the processing gas supplied into the processing module 60 needs to be properly managed in order to properly perform the gas process on the wafer W. However, due to manufacture tolerance, there are individual differences between each tanks or between each orifices 105 of the gas supply module 80 connected to the plurality of processing modules 60, and even when the gas processes are simply performed in the same condition, there is a risk that a discrepancy between a desired process gas condition (for example, a supply pressure or flow rate) and an actual gas process condition may occur.

Accordingly, in the preprocess of the gas process according to the present embodiment, first, for example, when the wafer processing apparatus 1 or the processing module 60 is shipped from a factory or start its first operation, the individual differences of the apparatus characteristics among the processing modules 60 are obtained. More specifically, a control pressure characteristic (a three-dimensional (3D) map which shows a relationship between a pressure, a temperature and a flow rate and which will be referred to as a "Ref control pressure") which is a reference for the orifice 105 installed in the tank unit 100 is determined by allowing an inert gas (for example, Ar gas) to flow through an interior of the tank unit 100.

Figure 5:
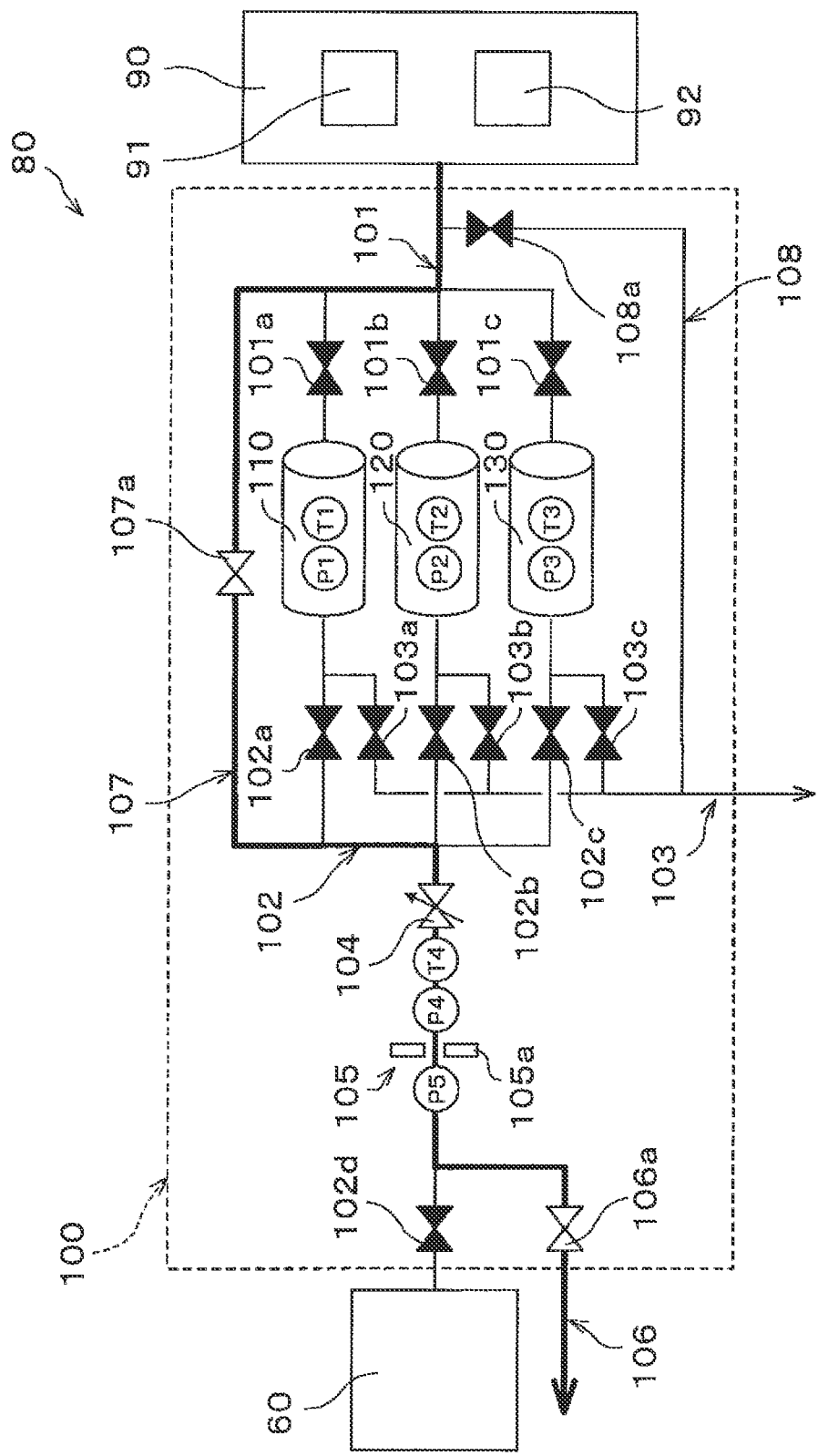
FIG. 5 is a schematic explanatory diagram illustrating a preprocessing state of a processing module.
Figure 6:
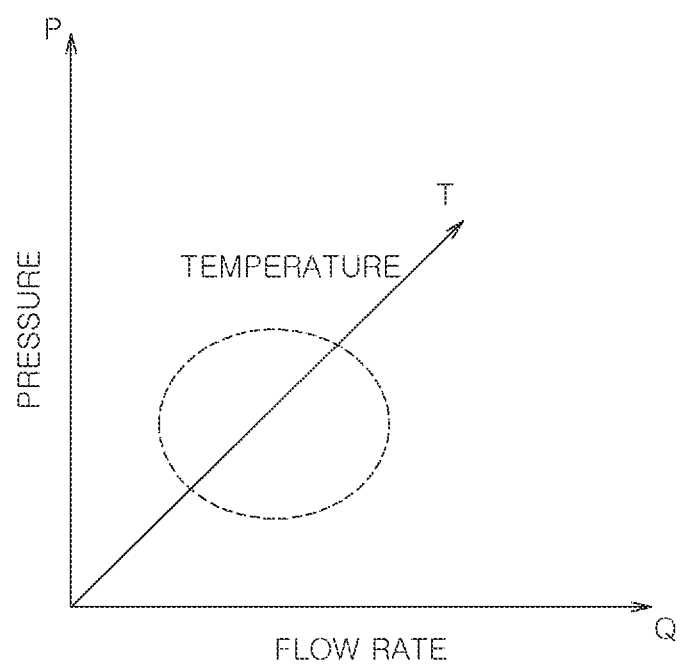
FIG. 6 is an explanatory graph showing one example of a control pressure property obtained in a processing module.

When the Ref control pressure of the orifice 105 is obtained, as shown in FIG. 5, the control valve 104, the valve 106a, and the valve 107a are opened, and in such state, the supply of the inert gas from the gas box 90 is started. Accordingly, the inert gas flows through the orifice 105 through the bypass pipe 107 (without flowing through three tanks 110, 120, and 130). In addition, the 3D map showing the Ref control pressure is drawn as shown in FIG. 6 on the basis of a measurement result of the pressure gauges P4 and P5 and the thermometer T4 of the orifice 105.

In addition, the plurality of processing modules 60, for example, six processing modules 60, are present in the wafer processing apparatus 1 according to the present embodiment. As described above, there are the individual differences between the orifices 105. That is, the orifices 105 of the six processing modules 60 have different characteristics. Accordingly, the determination operation of the Ref control pressure (3D map drawing) may be individually performed for each processing module 60 provided in the wafer processing apparatus 1.

In addition, in the present embodiment, although the Ref control pressure is determined by allowing the inert gas (for example, Ar gas) to flow through the interior of the tank unit 100, the kind of gas flowing therethrough for determining the Ref control pressure may be arbitrarily selected. However, in the wafer processing apparatus 1, when the wafer W is unloaded from the processing module 60, since the inside of the process module 60 is purged by an inert gas (Ar gas), it is preferable to use the inert gas (Ar gas) to determine the Ref control pressure in the same environment as when the wafer W is unloaded.

<Step S2: Check the Change of the Apparatus Characteristics>

When the gas process (step S5) starts in the processing module 60, there is a case in which apparatus characteristics of the wafer processing apparatus 1 or the processing modules 60 are changed due to environmental influences or aging deterioration when the wafer processing apparatus 1 or the processing modules 60 are shipped from the factory or start operating in step S1. In addition, when the apparatus characteristics are changed, there is a risk that a discrepancy between a desired process gas condition and an actual process gas condition may occur.

Accordingly, in the preprocess of the gas process according to the according to the present embodiment, for example, before the gas process (step S5) for the wafer W in the processing module 60 is started, the apparatus characteristics, that is, a control pressure property, is obtained through a method which is the same as that of step S1. In addition, whether the control pressure characteristics (apparatus characteristics) is changed is checked by comparing the obtained control pressure characteristics and the Ref control pressure determined in step S1.

Specifically, as shown in FIG. 5, an inert gas is supplied into the tank unit 100, and the control pressure characteristic of the orifice 105 is obtained on the basis of measurement results of the pressure gauges P4 and P5 and the thermometer T4 of the orifice 105. In addition, a discrepancy between the obtained control pressure characteristic and the Ref control pressure determined in step S1 is obtained, and when the discrepancy falls within a predetermined threshold value, it is determined that the apparatus characteristic is not changed and the gas process (step S5) may start in the processing module 60. Meanwhile, when the discrepancy does not fall within the predetermined threshold value, it is determined that the apparatus characteristic is changed and an alarm is notified to stop starting of the gas process. In addition, when the starting of the gas process is stopped, for example, the apparatus characteristic of the processing module 60 may be checked again after the processing module 60 is maintained separately from other processing modules 60.

In addition, the threshold value for comparing the control pressure characteristic and the Ref control pressure may be arbitrarily determined, and for example, sensor accuracy of the thermometer T4 and the pressure gauges P4 and P5 for obtaining the control pressure characteristic may be used as the threshold value. That is, if the control pressure characteristic measured in step S2 deviates significantly from measurement accuracy of the sensors when compared to the Ref control pressure determined in step S1, it may be determined that the apparatus characteristic is changed.

<Step S3: Determination of Ref Recipe Control Pressure>

As shown in steps S1 and S2, checking of the apparatus characteristic of the processing module 60 is performed by supplying an inert gas (Ar gas) to the tank unit 100. However, a mixed gas, in which one or more gases are mixed, is actually used as the processing gas in the gas process (step S5) for the wafer W. In addition, characteristics (for example, a viscosity or specific heat) of the processing gases are different from the characteristics of the inert gas (Ar gas). That is, the control pressure characteristics of the mixed gas and the inert gas are different. In addition, the characteristic of the processing gas is also changed due to kinds of gases used as the processing gases or a mixing ratio therebetween. Accordingly, the control pressure characteristic (a 3D map which shows a relationship between a temperature and a flow rate and which will be referred to as a "Ref recipe control pressure"), which is a reference for each kind of the processing gas used in the gas process, needs to be managed in order to properly perform the gas process on the wafer W.

Accordingly, in the preprocess of the gas process according to the present embodiment, when, for example, the processing module 60 starts operation or a recipe is added, the Ref recipe control pressure is determined for each processing gas used in the gas process. More specifically, a recipe control pressure is determined by supplying a target processing gas (mixed gas) into the tank unit 100.

Figure 7:
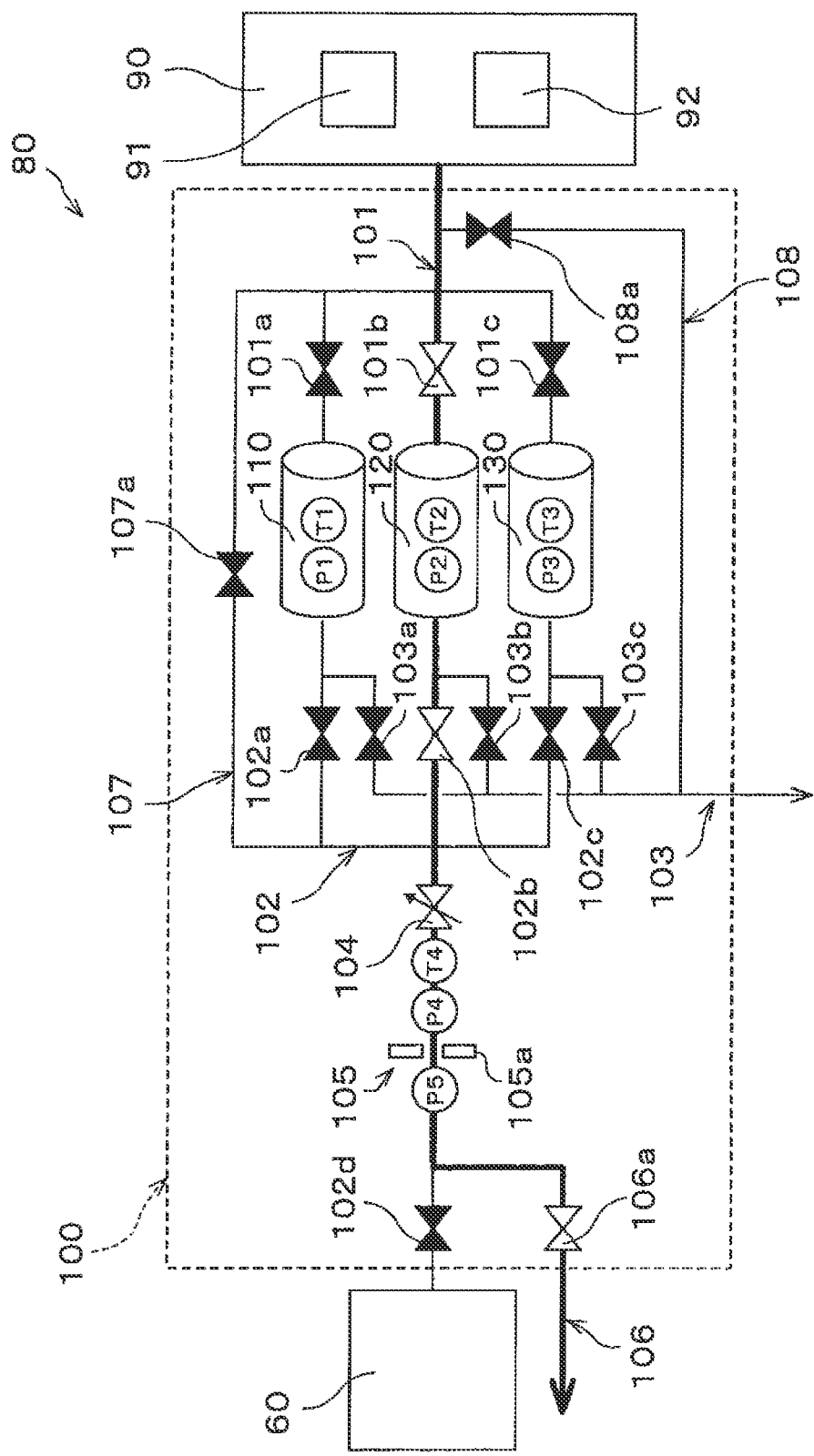
FIG. 7 is a schematic explanatory diagram illustrating a preprocessing state of the processing module.

When determining the Ref recipe control pressure, as shown in FIG. 7, for example, the valves 101b and 102b, the control valve 104, and the valve 106a are opened, and in such state, the gas box 90 starts to supply the target processing gas. Accordingly, for example, the target processing gas is allowed to flow through the orifice 105 through the tank 120. In addition, a flow rate of the mixed gas as the processing gas flowing through the orifice 105 is a flow rate (hereinafter, there is a case in which the flow rate is referred to as a "recipe flow rate") of the mixed gas actually used in the gas process for the wafer W. In addition, the 3D map representing the Ref recipe control pressure of the target processing gas is drawn on the basis of a measurement result of the pressure gauges P4 and P5 and the thermometer T4 of the orifice 105 as shown in FIG. 6.

In addition, the plurality of processing modules 60, for example, six processing modules 60, are present in the wafer processing apparatus 1 according to the present embodiment. As described above, there are the individual differences among the orifices 105 due to manufacture tolerance. In other words, the orifices 105 have different properties for each six processing modules 60. Accordingly, the determination operation for the Ref recipe control pressure (3D map drawing) may be performed for each processing module 60 installed in the wafer processing apparatus 1.

In addition, there are individual differences in the apparatus characteristics among the tanks 110, 120, and 130 as described above. In other words, assuming a gas process is performed for each tank among the three tanks in the same condition, there is a risk that a discrepancy may occur between the desired process gas condition and the actual process gas condition for each tank. Accordingly, the determination operation for the Ref recipe control pressure may be individually performed for each of the tanks 110, 120, and 130 installed in the tank unit 100.

<Step S4: Amend Recipe Control Pressure>

The characteristics (for example, a viscosity or specific heat) of a processing gas used in the gas process for the wafer W is changed due to an atmosphere in which the corresponding gas process is performed. Specifically, for example, there is a risk that the characteristics of the processing gas supplied from the gas box 90 is changed due to a change in temperature in an atmosphere of the processing module 60 in which the tank unit 100 is installed. Accordingly, in order to properly perform the gas process on the wafer W, before the gas process for the wafer W is started, the recipe control pressure of the processing gas needs to be amended in accordance with an environment (for example, an atmospheric temperature).

Accordingly, in the preprocess of the gas process according to the present embodiment, for example, before the gas process (step S5) for the wafer W is started in the processing module 60, a temperature of the processing gas flowing through the interior of the tank unit 100 is measured. In addition, the recipe control pressure of the processing gas used in the actual gas process is amended for on the basis of the obtained temperature and the Ref recipe control pressure determined in step S3.

Specifically, as shown in FIG. 7, the processing gas is supplied into the tank unit 100, and a temperature of the processing gas is measured using the thermometer T4 before the gas process (step S5) for the wafer W is started in the processing module 60. In addition, the recipe control pressure is amended on the basis of the measured temperature and the Ref recipe control pressure determined in step S3. Although a method for amending the recipe control pressure may be arbitrarily determined, for example, a difference between a temperature of the processing gas measured in step S3 and the temperature of the processing gas measured in step S4 may be used to amend the recipe control pressure by using a gas state equation.

In the above-description, the case in which the temperature of the processing gas flowing through the tank unit 100 is measured by the thermometer 14 is described as an example. For example, however, when the processing gas flows through the tank 120, a temperature of the processing gas may be measured by the thermometer T2 connected to the corresponding tank 120. In addition, for example, when any one tank is filled with the processing gas for the gas process for the wafer W, a temperature of the processing gas may be measured by the thermometer T1, T2, or T3 connected to the corresponding tank.

In addition, as shown in FIG. 7, when the temperature of the processing gas flowing through the tank unit 100 (tank 120) is measured, after the temperature is measured, the valve 102b may be closed to continuously fill the tank 120 with the processing gas for performing the gas process on the wafer W.

According to steps S1 to S4, before the processing module 60 performs the gas process on the wafer W, the checking operation for the apparatus characteristics and the management operation for the recipe are performed. Accordingly, for example, even when the apparatus characteristic or atmosphere temperature in which the gas process is performed is changed, the gas process, which will be described below, may be properly performed.

<Step S5: Gas Process for Wafer W>

Figure 8:
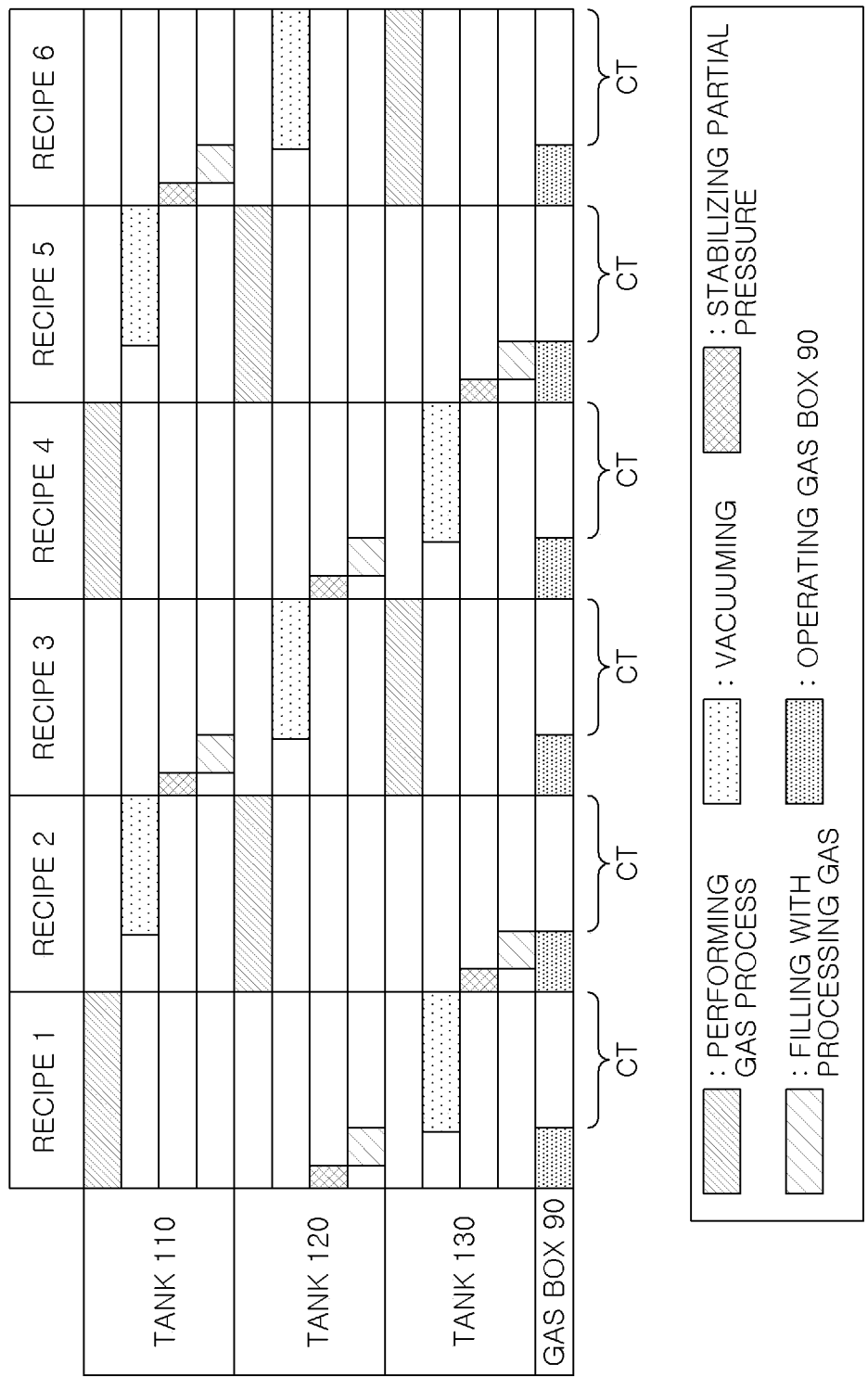
FIG. 8 is a chart view showing a main process of supplying a processing gas to the processing module.

Next, the gas process for the wafer W for which the aforementioned preprocess have been performed in the processing module 60 will be described. FIG. 8 is a schematic flowchart illustrating a method of supplying the processing gas to the processing module 60 from the gas box 90. FIGS. 9 to 14 are explanatory diagrams illustrating main processes of the method for supplying the processing gas shown in the flowchart of FIG. 8. In the wafer processing apparatus 1, although gas processes for the wafers W are performed in the plurality of processing modules 60 in parallel, an example in which only one processing module 60 performs the gas process will be described for the sake of simplification in the following description. In addition, in the following description, before the gas process for the wafer W is started in the processing module 60, the tank 110 has been filled with the target processing gas in advance.

Figure 9:
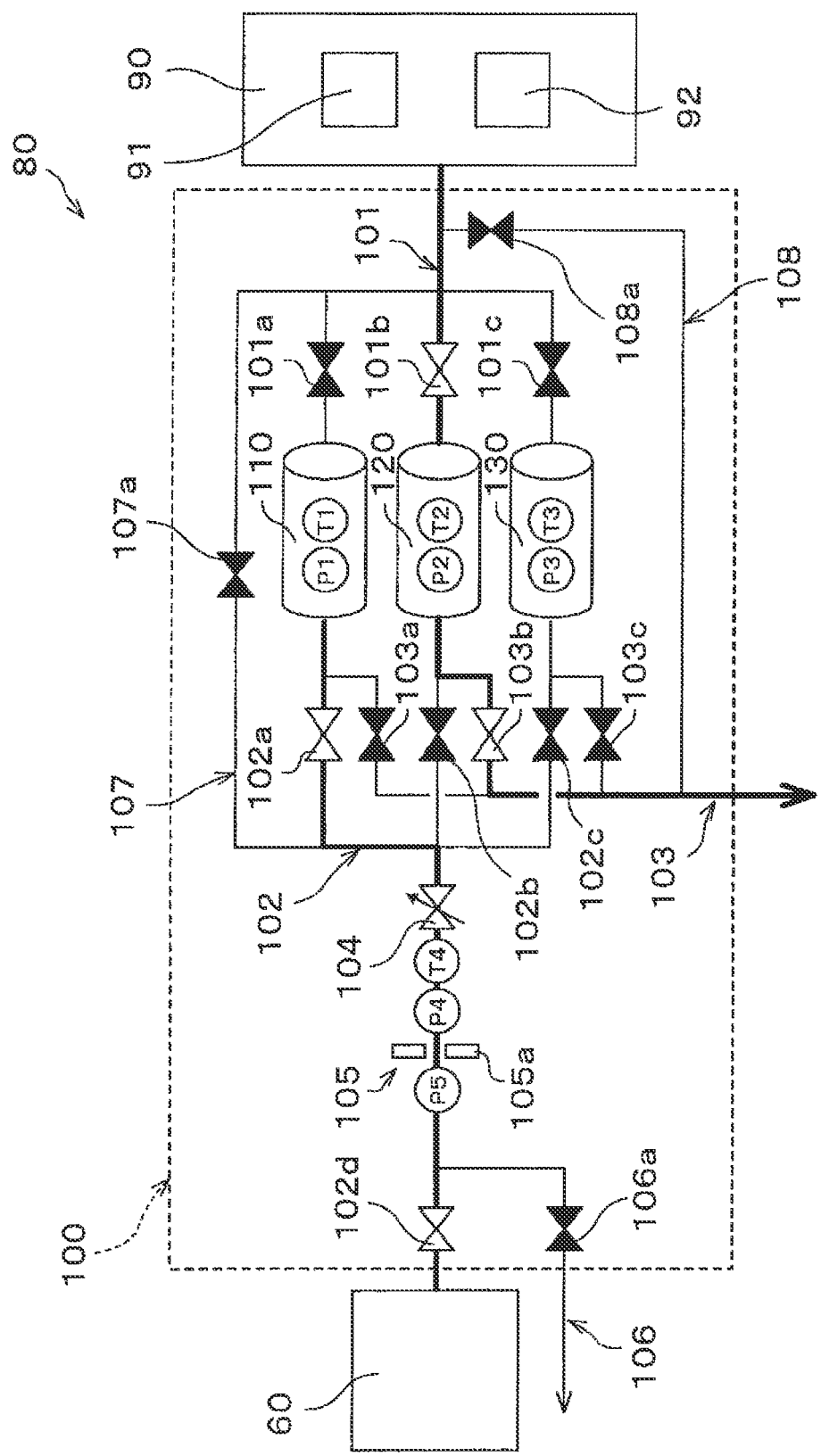
FIG. 9 is an explanatory diagram illustrating a state of the supply of the processing gas to the processing module.

When performing a gas process on the wafer W in the processing module 60, the valve 102a, the control valve 104, and the valve 102d are opened to supply the processing gas, with which the tank 110 is filled, to the processing module 60 (recipe 1 of the tank 110 of FIG. 8) as shown in FIG. 9. In this case, a degree of opening (a flow rate of the processing gas supplied to the processing module 60) of the control valve 104 is determined on the basis of the recipe control pressure amended in step S4 based on the kind and the temperature of the processing gas.

When the supply of the processing gas from the tank 110 to the processing module 60 is started, a process of filling the tank 120 with the processing gas for the following recipe in the processing module 60 is started, as shown in FIG. 9. Specifically, first, in a state in which the valve 101b and the valve 103b are opened, the supply of the target processing gas from the gas box 90 is started and the processing gas flows through the tank 120 (recipe 1 of the tank 120 of FIG. 8).

In order to properly perform the gas process in the processing module 60, it is important to properly manage a mixing ratio of the processing gas supplied into the corresponding processing module 60. Accordingly, in case the process of filling the tank 120 with the processing gas is performed according to the present embodiment, first, a partial pressure ratio of the processing gas supplied from the gas box 90 is stabilized by allowing the processing gas to flow through the tank 120 in the state where the valve 101b and the valve 103b are opened. The partial pressure ratio of the processing gas may be managed by, for example, a flow controller 92 (for example, a mass flow controller).

In addition, in case the stabilization process of the partial pressure ratio of the processing gas is performed, it is preferable that a large flow rate, for example, five times the recipe flow rate, of the processing gas flows therethrough, while maintaining a recipe flow rate of the processing gas supplied from the gas box 90. Specifically, for example, when the recipe flow rate [sccm] of the processing gas supplied from the gas box 90 is $Ar:O_2:C_4F_6=800:200:100$, it is preferable to flow the processing gas with a flow rate [sccm] of $Ar:O_2:C_4F_6=4000:1000:500$. As described above, by maintaining the recipe flow rate of the gas process and allowing the processing gas to flow with the large flow rate, a time required to stabilize the partial pressure ratio may be reduced.

Figure 10:
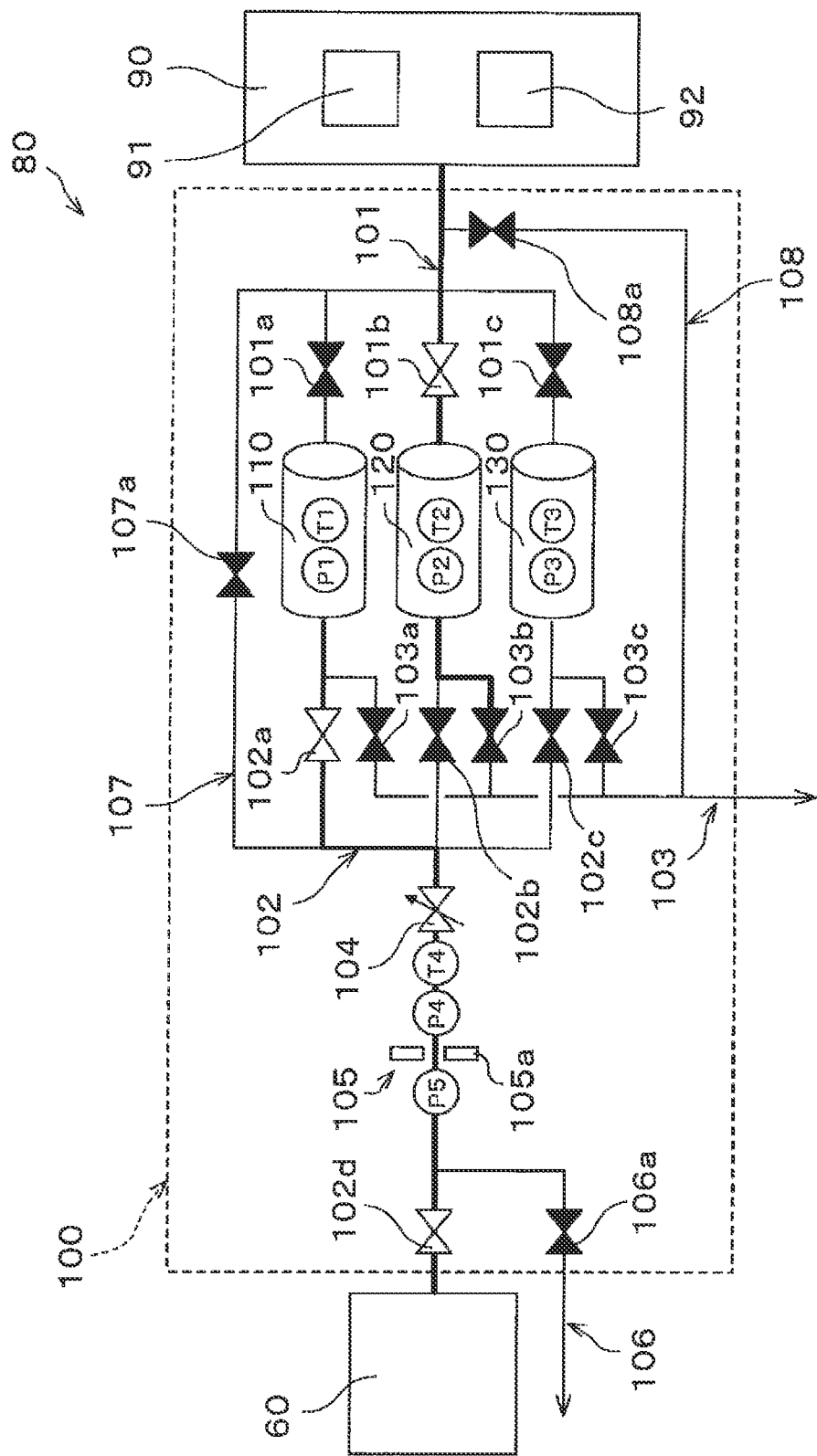
FIG. 10 is an explanatory diagram illustrating a state of the supply of the processing gas to the processing module.

When the stabilization of the partial pressure ratio of the processing gas supplied from the gas box 90 is ascertained, next, as shown in FIG. 10, the valve 103b is closed to start filling of the tank 120 with the processing gas (recipe 1 of the tank 120 of FIG. 8). The filling pressure of the processing gas for the tank 120 may be managed by, for example, the pressure gauge P2.

When the tank 120 is filled with the processing gas, like the stabilizing process of the partial pressure ratio, it is preferable to maintain a recipe flow rate of the processing gas supplied from the gas box 90, and it is preferable that the filling is performed at a large flow rate, for example, five times the recipe flow rate. As described above, by maintaining the recipe flow rate of the gas process and allowing the processing gas to flow with the large flow rate, it is possible to reduce a time for filling the tank 120 with the processing gas while maintaining the partial pressure ratio of the processing gas used in the gas process.

Figure 11:
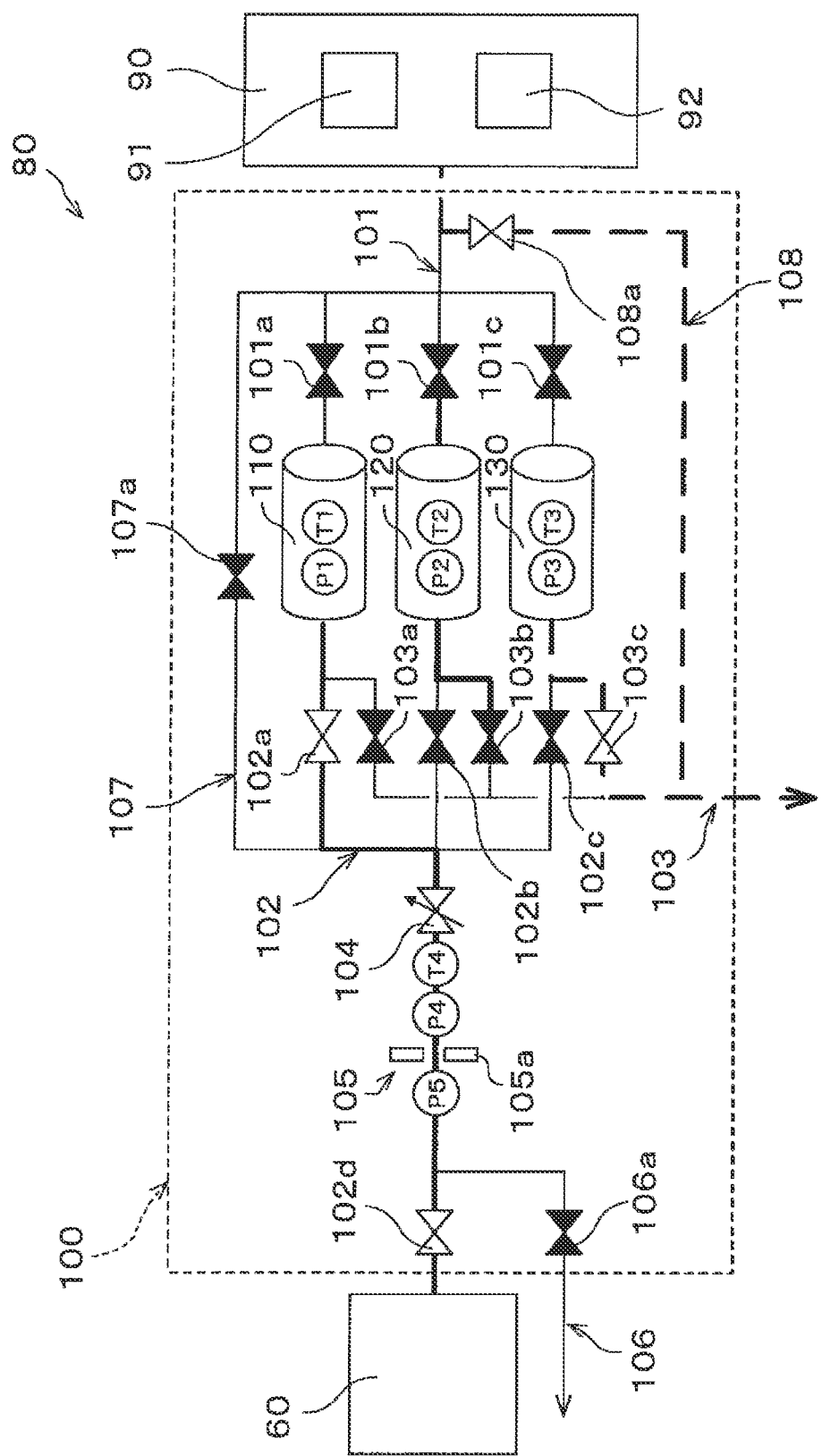
FIG. 11 is an explanatory diagram illustrating a state of the supply of the processing gas to the processing module.

When an internal pressure of the tank 120 increases to a desired value, in other words, when the filling of the tank 120 with the processing gas is completed, the valve 101b is closed so that the filling of the tank 120 with the processing gas is completed, as shown in FIG. 11. Next, as a preprocess for starting a process of filling the tank 130 with the processing gas, the valve 103c and the valve 108a are opened, and residual gas in the tank 130 and the upstream side pipe 101 is exhausted (recipe 1 of the tank 130 of FIG. 8). If the processing gas used in the previous recipe remains in the tank 130 or the upstream side pipe 101, there is a risk that the residual gas may be supplied to the processing module 60 to hinder a desired recipe from being performed. In the present embodiment, the residual gas in the tank 130 and the upstream side pipe 101 are exhausted to suppress the influence of the residual gas on the recipe.

When the process recipe (recipe 1 of FIG. 8) using the processing gas with which the tank 110 is filled is completed, next, a next recipe process (recipe 2 of FIG. 8) is started using the processing gas with which the tank 120 is filled. Specifically, as shown in FIG. 12, the supply of the processing gas to the processing module 60 from the tank 110 is stopped by closing the valve 102a, and the supply of the processing gas to the processing module 60 from the tank 120 is started by opening the valve 102b at the same time.

In this case, a degree of opening (a flow rate of the processing gas supplied to the processing module 60) of the control valve 104 is determined on the basis of the recipe control pressure amended in step S4 based on the kind and the temperature of the processing gas.

Figure 12:
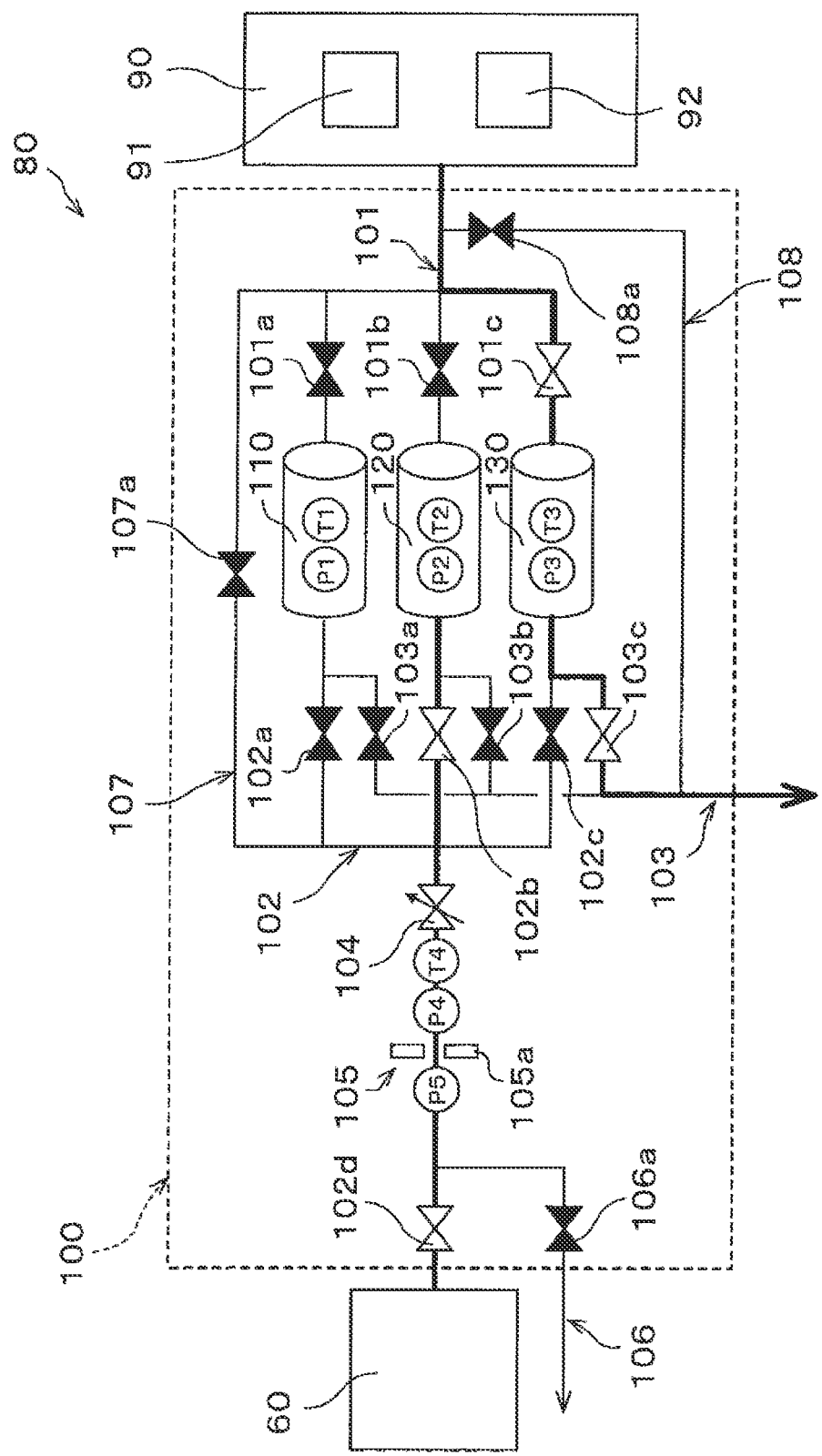
FIG. 12 is an explanatory diagram illustrating a state of the supply of the processing gas to the processing module.

In addition, when the supply of the processing gas from the tank 120 to the processing module 60 is started, as shown in FIG. 12, a process of filling the tank 130 with the processing gas for the next recipe in the processing module 60 is performed. Specifically, after the valve 108a is closed, in a state in which the valve 101c and the valve 103c are opened, the supply of a target processing gas from the gas box 90 is started to allow the processing gas to flow through an interior of the tank 130. In addition, a partial pressure ratio of the processing gas may be managed by the flow controller 92 (for example, the mass flow controller).

Figure 13:
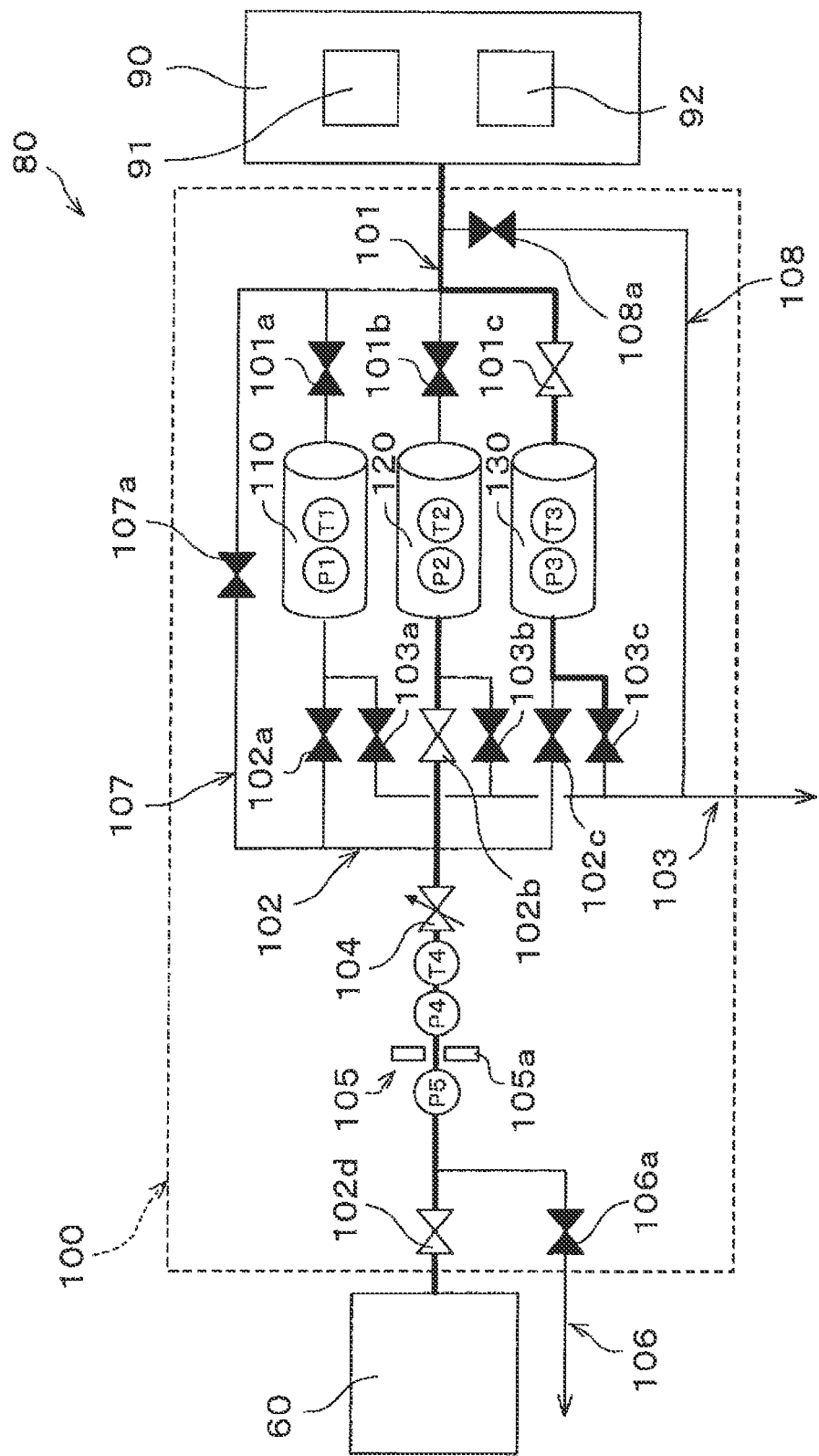
FIG. 13 is an explanatory diagram illustrating a state of the supply of the processing gas to the processing module.

Once the stabilization of the partial pressure ratio of the processing gas supplied from the gas box 90 is ascertained, next, as shown in FIG. 13, the valve 103c is closed to start filling of the tank 130 with the processing gas (recipe 2 of the tank 130 of FIG. 8). A filling pressure of the processing gas for the tank 130 may be managed by, for example, the pressure gauge P3.

In the process of filling the tank 130 with the processing gas, like the process of filling the tank 120 with the processing gas, it is preferable to maintain a recipe flow rate of the processing gas supplied from the gas box 90, and it is preferable that the filling is performed at a large flow rate, for example, five times the recipe flow rate. As described above, by maintaining the recipe flow rate used in the gas process and performing the filling process with the processing gas at the large flow rate, a time for filling the tank 130 with the processing gas may be reduced.

As described above, the process of filling the tank 130 with the processing gas is performed through a method which is the same as the method of performing the process of filling the tank 120 with the processing gas.

Figure 14:
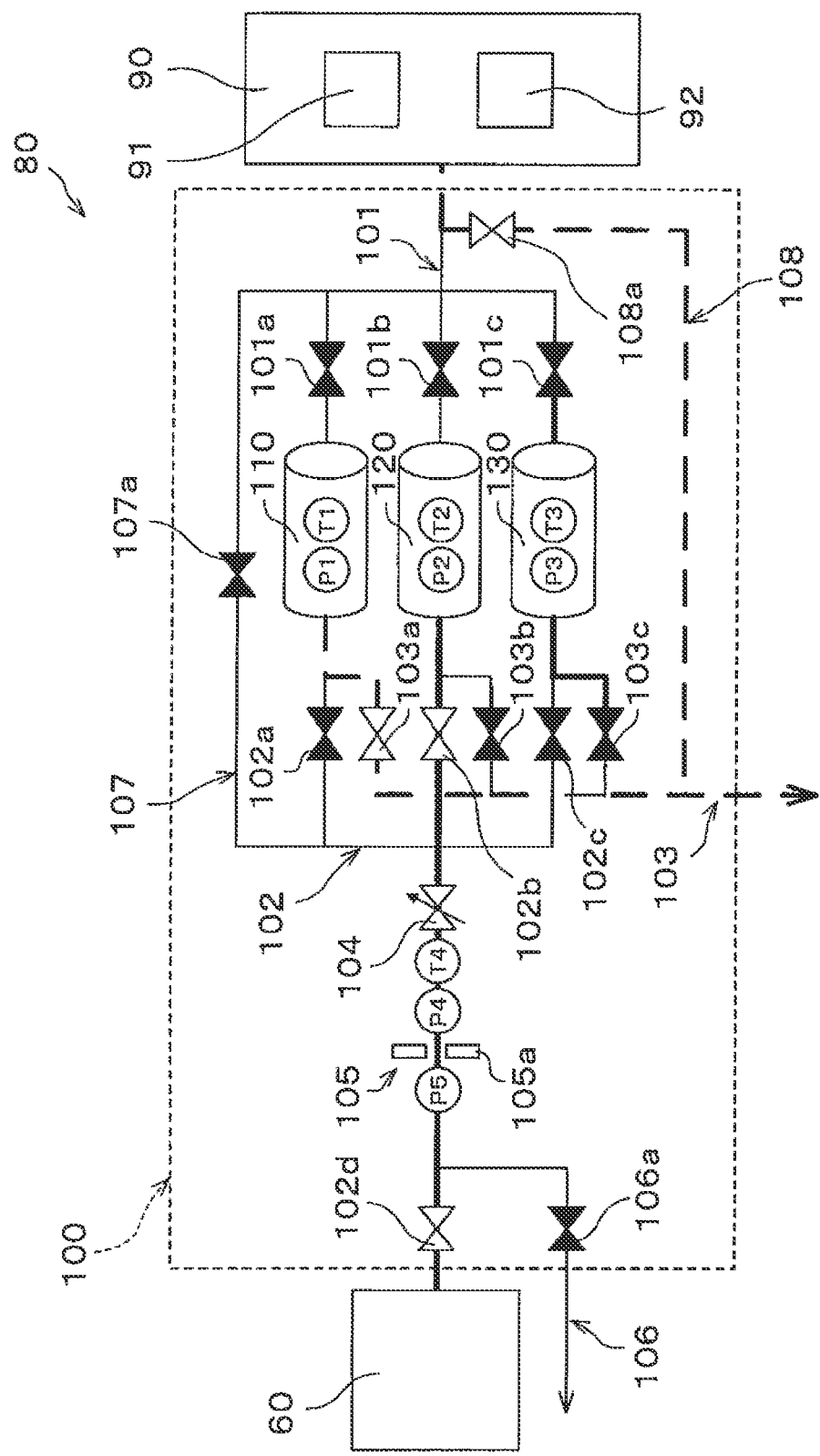
FIG. 14 is an explanatory diagram illustrating a state of the supply of the processing gas to the processing module.

When the filling of the tank 130 with the processing gas is completed, as shown in FIG. 14, the valve 101c is closed so that the filling of the tank 130 with the processing gas is completed. In addition, as a preprocess for starting the process of filling the tank 110 with the processing gas, the valve 103a and the valve 108a are opened, and residual gas in the tank 110 and the upstream side pipe 101 is exhausted (recipe 2 of the tank 110 of FIG. 8). A method of exhausting the residual gas of the tank 110 is the same as the method of exhausting the residual gas in the recipe 1 of the tank 130.

Then, as shown in FIG. 8, the same processes, that is, the supply of the processing gas to the processing module 60 (performing of the gas process), exhausting (vacuum exhausting) of residual gas after the gas process, stabilization of the partial pressure ratio by allowing the processing gas to flow, and filling of the processing gas are repeatedly performed for the tanks 110, 120, and 130. When the wafer W are completely processed according to all recipes (in the present embodiment, recipes 1 to 6) in the processing module 60, the gas process (step S5) for the wafer W in the processing module 60 is completed.

<Effects of Technology Related to Present Invention>

As described above, according to the method of supplying the processing gas for the gas process for the wafer W in the present embodiment, the performing of the gas process, the exhausting of residual gas after the gas process, and the process of filling the plurality of tanks 110, 120, and 130 installed in the tank unit 100 with the processing gas are performed in parallel. Accordingly, even when the gas process for the wafer W includes a plurality of process recipes using different processing gases, there is no need to stop the gas process between the process recipes. In other words, it is possible to reduce the number of the gas boxes 90 installed in the wafer processing apparatus 1, while maintaining fast responsiveness for the gas process for the wafer W.

Further, according to the present embodiment, since each of the processes of filling the tanks 110, 120, and 130 with the processing gases is performed at a large flow rate in a state in which a recipe flow rate is maintained, a time required for the filling process can be reduced.

In this case, when the supply of the processing gas is performed from the gas box 90 to only one processing module 60, the time for the filling process is reduced so that a time, that is, a cool time CT, in which the supply of the processing gas to the gas box 90 is not performed, can be secured as shown in FIG. 8. That is, although the plurality of processing modules 60 are installed in the wafer processing apparatus 1, the processing gases can be supplied to the plurality of processing modules 60 by one gas box 90 by using the cool time CT without stopping the gas processes.

Figure 15:
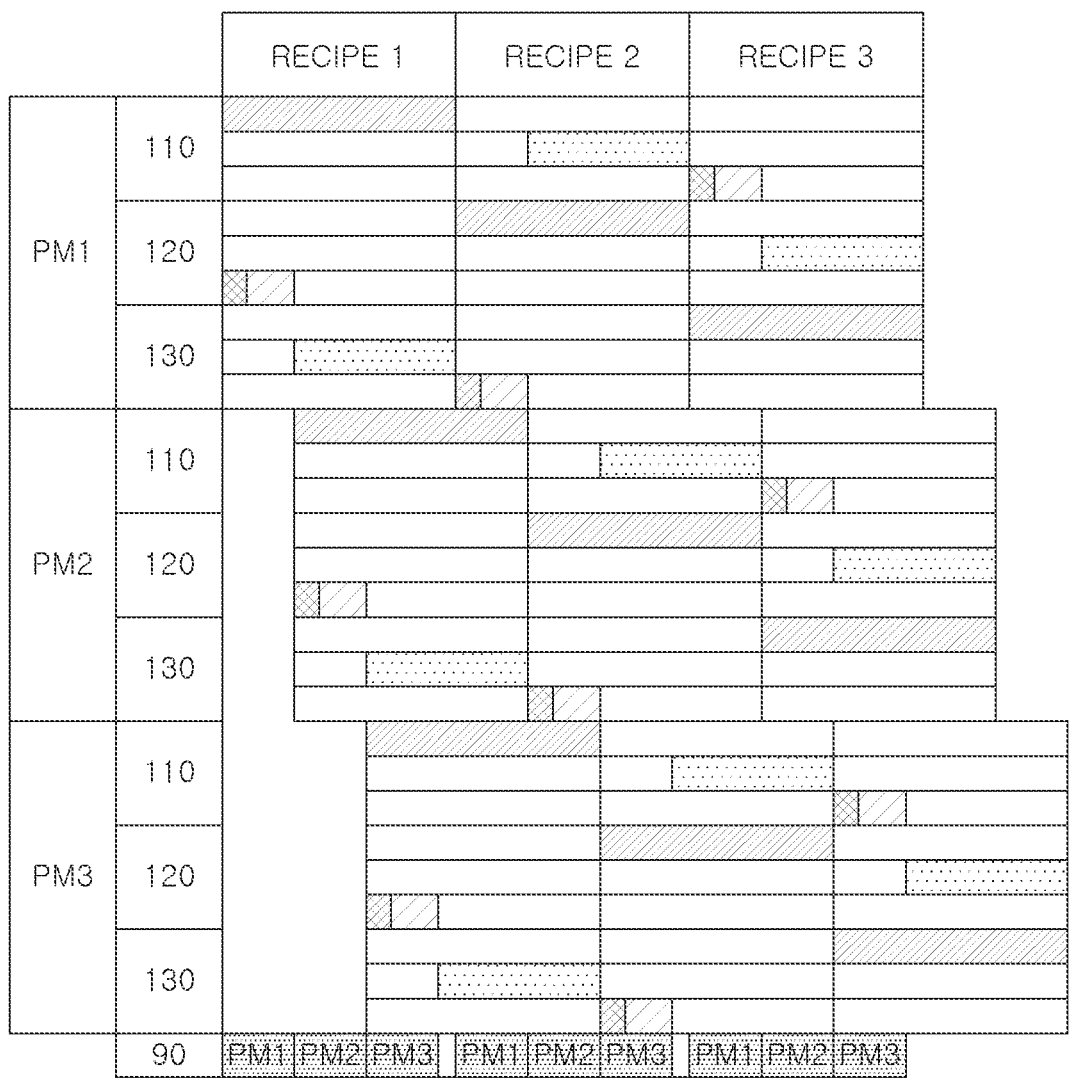
FIG. 15 is a chart view showing main processes of supplying a processing gas according to another embodiment.
Figure 15:
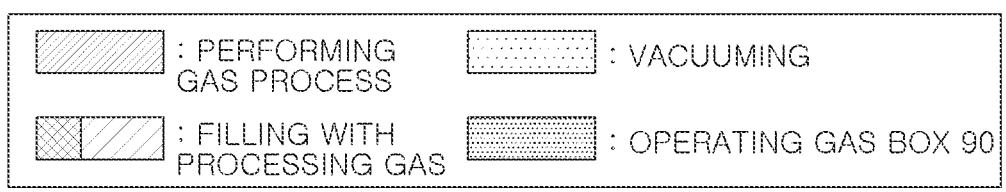

FIG. 15 is a flowchart illustrating a flow of supplying a processing gas when a plurality of processing modules 60 are connected to a gas box 90. As shown in FIG. 15, by using a cool time CT of the gas box 90 for one processing module 60 (PM1 in the drawing), filling processes with processing gases are performed for other processing modules 60 (PM2 and PM3 in the drawing) so that gas processes can be performed continuously without stopping recipes for each processing module 60. In other words, in a state in which fast responsiveness for the gas process for the wafer W is maintained, the number of the gas boxes 90 installed in a wafer processing apparatus 1 can be reduced, and a wafer process can be properly performed.

In addition, in the present embodiment, three processing modules 60 are connected to one gas box 90 as shown in FIG. 1 or FIG. 15 on the basis of a relationship between a length of a usage time (processing gas filling time) of the gas box 90 and a length of an unused time (cool time CT) of the gas box 90 for one processing module 60. However, the number of the processing modules 60 connected to one gas box 90 is not limited thereto and may be arbitrarily determined on the basis of the relationship between the length of the usage time and the unused time of the gas box 90.

Specifically, for example, when a length (a time for performing a gas process) of one recipe process performed in the processing module 60 increases, a cool time CT of the gas box 90 increases relatively. Therefore, the number of the processing modules 60 connected thereto may increase. Further, for example, in the above-described embodiment, it has been described that the filling process with the processing gas is performed at the large flow rate, for example, five times the recipe flow rate. Therefore, the usage time of the gas box 90 can be reduced by performing the filling process with the processing gas at the large flow rate as described above so that the number of the processing modules 60 connected thereto can be increased.

As described above, the number of the processing modules 60 connected to one gas box 90 can be arbitrarily determined from the relationship between the usage time and the unused time of the gas box 90. Put differently, due to the number of the processing modules 60 connected to the gas box 90, gas boxes 90 installed in the wafer processing apparatus 1 can be arbitrarily determined. In addition, as a result, by decreasing the number of the gas boxes 90 installed therein compared to the number of the processing modules 60 installed therein, a cost or space for installing the corresponding gas boxes 90 can be reduced when compared to a conventional wafer processing apparatus.

In addition, in the above-described embodiment, an example, in which three tanks 110, 120, and 130 are installed in the tank unit 100 installed in one processing module 60, has been described, the number of the tanks installed in the tank unit 100 is also not limited thereto.

For example, in the sequential recipe processes at the processing module 60, if each recipe process is performed using mixed gases including the same gases, a step of exhausting residual gases in the tank and the upstream side pipe 101 does not need to be performed. In other words, since the number of processes performed in the tanks in parallel is reduced, the number of the tanks installed in the tank unit 100 can be reduced to two.

In addition, for example, as described above, when each of the processes for filling the tanks with the processing gases is performed at a large flow rate, a time required for the corresponding filling process can be reduced. Accordingly, while the gas process is performed in one tank, exhausting of residual gases in another tank and a process of filling another tank with the processing gases may be sequentially performed so that the number of the tanks installed in the tank unit 100 can be reduced.

In addition, in the above-described embodiment, the processing module 60 is a decompression module in which a process is performed on the wafer W in a decompression state. However, as long as the wafer processing apparatus can perform gas processes in the plurality of processing modules in parallel, the technology according to the present invention can be applied even in case when the processing module 60 is a stand-by module.

The present embodiment should be considered as only an example in all aspects and not as a restriction. The embodiment may be omitted, substituted, and modified in various forms without departing from the scope and the spirit of the appended claims.

The invention claimed is:

1. A processing apparatus, comprising:
a plurality of processing chambers configured to process one or more substrates in an atmosphere of a desired processing gas;
a plurality of tank units provided for the plurality of processing chambers respectively, each of the plurality of tank units including a plurality of tanks configured for temporarily storing the processing gas;
one or more gas boxes configured to supply the processing gas to the processing chambers via the tank units; and
a controller,
wherein the plurality of tank units includes a first tank unit having a first tank, a second tank, and a third tank,
wherein the controller is configured to perform control to (A) supply the processing gas from the first tank to one of the processing chambers, (B) fill the second tank with the processing gas by supplying the processing gas to the second tank from one of the gas boxes including (a) opening a valve installed at a downstream side of the second tank to allow the processing gas to flow and stabilizing a partial pressure of the processing gas flowing from the one of the gas boxes and (b) closing the valve to fill the second tank with the processing gas, and (C) exhaust the processing gas remaining in the third tank in parallel,
wherein the processing gas includes a mixed gas in which a plurality of kinds of gases are mixed, and wherein, when performing (B), the controller is configured to perform the stabilizing with a first flow rate that is larger than a second flow rate that is a flow rate of the processing gas supplied from the one or more gas boxes and maintain a ratio of the first flow rate with respect to the second flow rate.

2. The processing apparatus of claim 1, wherein
the one or more gas boxes are provided in a plurality, and
each of the plurality of gas boxes is connected to at least two processing chambers among the plurality of processing chambers.

3. The processing apparatus of claim 2, comprising a connection pipe configured to connect between the plurality of gas boxes,
wherein a cushion part for absorbing rigidity is formed in the connection pipe.

4. The processing apparatus of claim 3, wherein the cushion part is a bent part.

5. The processing apparatus of claim 4, wherein the bent part includes at least two changes in direction in the connection pipe.

6. The processing apparatus of claim 4, wherein the bent part includes at least three changes in direction in the connection pipe.

7. The processing apparatus of claim 4, wherein the bent part includes at least four changes in direction in the connection pipe.

8. The processing apparatus of claim 4, wherein
the bent part includes a plurality of sections of the connection pipe, and
respective pairs of the sections connect with one another at at least two different angles.

9. The processing apparatus of claim 4, wherein
the bent part includes a plurality of sections of the connection pipe, and
respective pairs of the sections connect with one another at a same angle.

10. The processing apparatus of claim 4, wherein
the bent part includes a plurality of sections of the connection pipe, and
four pairs of the sections connect with one another at a same angle.

11. The processing apparatus of claim 1, wherein the plurality of processing chambers includes a first processing chamber and the first tank unit is provided for the first processing chamber, and
wherein the controller is configured to perform processing a substrate while (A) the supplying the processing gas to the first processing chamber from the first tank.

12. A method of processing a substrate in a processing apparatus including: a processing chamber configured to process the substrate in an atmosphere of a desired processing gas; a tank unit including a plurality of tanks configured for temporarily storing the processing gas; and a gas box configured to supply the processing gas to the processing chamber via the tank unit, the method comprising:
(A) processing the substrate by supplying the processing gas to the processing chamber from a first tank;
(B) filling a second tank with the processing gas by supplying the processing gas to the second tank from the gas box including (a) opening a valve installed at a downstream side of the second tank to allow the processing gas to flow and stabilizing a partial pressure of the processing gas flowing from the gas box and (b) closing the valve to fill the second tank with the processing gas, and
(C) exhausting the processing gas remaining in a third tank,
wherein (A), (B) and (C) are performed in parallel,
wherein the processing gas includes a mixed gas in which a plurality of kinds of gases are mixed, and
wherein, performing (B) includes performing the stabilizing with a first flow rate that is larger than a second flow rate that is a flow rate of the processing gas supplied from the gas box and maintaining a ratio of the first flow rate with respect to the second flow rate.

* * * * *